United States Patent [19]

Bobb

[11] 4,450,406

[45] May 22, 1984

[54] TRIAXIAL OPTICAL FIBER SYSTEM FOR MEASURING MAGNETIC FIELDS

[75] Inventor: Lloyd C. Bobb, Willow Grove, Pa.

[73] Assignee: The United States of America as represented by the Secretary of the Navy, Washington, D.C.

[21] Appl. No.: 308,310

[22] Filed: Oct. 5, 1981

[51] Int. Cl.$^3$ .................... G01R 33/032; G02F 1/09; G02B 5/172

[52] U.S. Cl. .................... 324/247; 250/227; 324/244; 350/96.1; 350/376

[58] Field of Search .............. 324/244, 247, 260, 96, 324/345; 350/96.29, 96.30, 374–376, 96.1, 96.33; 250/227

[56] References Cited

U.S. PATENT DOCUMENTS

| | | | |
|---|---|---|---|
| 2,485,931 | 10/1949 | Slonczewski | 324/247 |
| 3,605,013 | 9/1971 | Yoshikawa et al. | 324/96 |
| 3,936,742 | 2/1976 | Krause | 324/96 |
| 4,070,620 | 1/1978 | Feldtkeller et al. | 324/96 |
| 4,070,622 | 1/1978 | Harms et al. | 324/96 |
| 4,229,697 | 10/1980 | Petrosky et al. | 324/345 X |
| 4,371,838 | 2/1983 | Griscom | 324/244 |
| 4,376,248 | 3/1983 | Giallorenzi et al. | 324/96 X |

Primary Examiner—Gerard R. Strecker
Attorney, Agent, or Firm—Robert F. Beers; Henry Hansen; Armand M. Vozzo, Jr.

[57] ABSTRACT

An optical system is disclosed wherein light is transmitted through fiber-optic members orthogonally configured in a triaxial arrangement for measuring the magnetic field vector preset in the environment. In one preferred embodiment, a set of three fiber-optic coils positioned coaxially along respective orthogonal axes and having predetermined lengths and diameters are coupled to a source of polarized light for transmitting the light subject to Faraday rotation of its plane of polarization. In another preferred embodiment, light, not necessarily polarized. is transmitted along respective orthogonal axes through a set of three bifurcated fiber-optic cables each formed having a reference branch and a substantially equilaterally sensor branch on which a magnetostrictive material is intimately connected to produce optical path length changes related to the magnetic field component along the respective axes. Photodetectors are used in both embodiments to produce current signals indicative of characteristic changes in the transmitted light, and the current signals are digitally processed to provide magnitude and directional information regarding the magnetic field vector.

15 Claims, 4 Drawing Figures

TRIAXIAL OPTICAL FIBER SYSTEM FOR MEASURING MAGNETIC FIELDS

STATEMENT OF GOVERNMENT INTEREST

The invention described herein may be manufactured and used by for the Government of the United States for governmental purposes without the payment of any royalties thereon or therefor.

BACKGROUND OF THE INVENTION

The present invention relates to devices used for the detection of magnetic fields and more particularly to an improved system wherein optical fibers are used to transmit polarized light for measuring the magnitude and direction of a magnetic field.

In the detection and measurement of a magnetic field environment, various field-responsive sensors have been employed in compasses to detect field direction and in magnetometers to measure field strength. Although these magnetic field sensors, useful for navigational purposes as well as underwater and subsurface exploration, have generally been accurate regarding the true nature of the magnetic field vector in a particular area, greater sensitivity and reliability is being required, particularly of those sensors employed in current airborne applications.

While various magnetic field sensors have been developed for determining the direction of the magnetic field in an area and for detecting the associated field strength, they have not been entirely effective in providing the high degree of accuracy and reliability now being demanded. Specifically, the continued use of and reliance on electrical sensing elements subject many existing magnetic field sensors to errors from self-generated inteference. In addition the inclusion of moving parts in numerous field-responsive sensors subject them to wear and the associated problems caused thereby. Finally, existing field sensor systems have evidenced an overall need for increased sensitivity in order to improve the accuracy of measurement of relatively small magnetic fields.

SUMMARY OF THE INVENTION

Accordingly, it is a general purpose and object of the present invention to provide an improved magnetic field detection system for accurately determining the magnitude and direction of the magnetic field in the environment.

Another object of the present invention is to provide a magnetic field-responsive system having increased sensitivity to permit effective measurement of very small magnetic fields Still another object of the present invention is to provide a magnetic field detection system that rapidly and continuously indicates information regarding the strength, declination and heading of the magnetic field present in the area.

A further object of the present invention is to provide a magnetic field detector that is highly reliable, relatively inexpensive to construct, and easily adaptable to existing field-sensing applications.

Briefly, these and other objects of the present invention are accomplished by an optical system wherein light is transmitted through fiber-optic members orthogonally configured in a triaxial arrangement for measuring the magnetic field vector present in the environment. In one preferred embodiment, a set of three fiber-optic coils positioned coaxially along respective orthogonal axes and having predetermined lengths and diameters are coupled to a source of polarized light for propagating the light subject to Faraday rotation of its plane of polarization. The light is further transmitted through respective optics including a collimator and Wollaston prism for producing a pair of divergent beams of separate polarizations the intensities of which are indicative of the degree of Faraday rotation. Photodetectors receive the divergent beams, producing current signals proportional to the beam intensities, and the current signals are digitally processed to indicate magnitude and directional information regarding the magnetic field.

In another preferred embodiment, light, not necessarily polarized, is transmitted along respective orthogonal axes through a set of three bifurcated fiber-optic cables each formed having a reference branch and a substantially equilateral sensor branch onto which a magnetostrictive material, such as nickel, is intimately connected. Indicative of optical path length changes through the respective sensor branches caused by longitudinal magnetostriction of the material, relative phase changes of the light transmitted through the cables are detected and converted into current signals which are digitally processed to determine the magnetic field components along the respective axes.

For a better understanding of these and other aspects of the present invention, reference may be made to the following detailed description taken in conjunction with the accompanying drawing in which like reference numerals designate like parts throughout the figures thereof.

DEXCRIPTION OF THE PREFERRED EMBODIMENT

Figure 1:
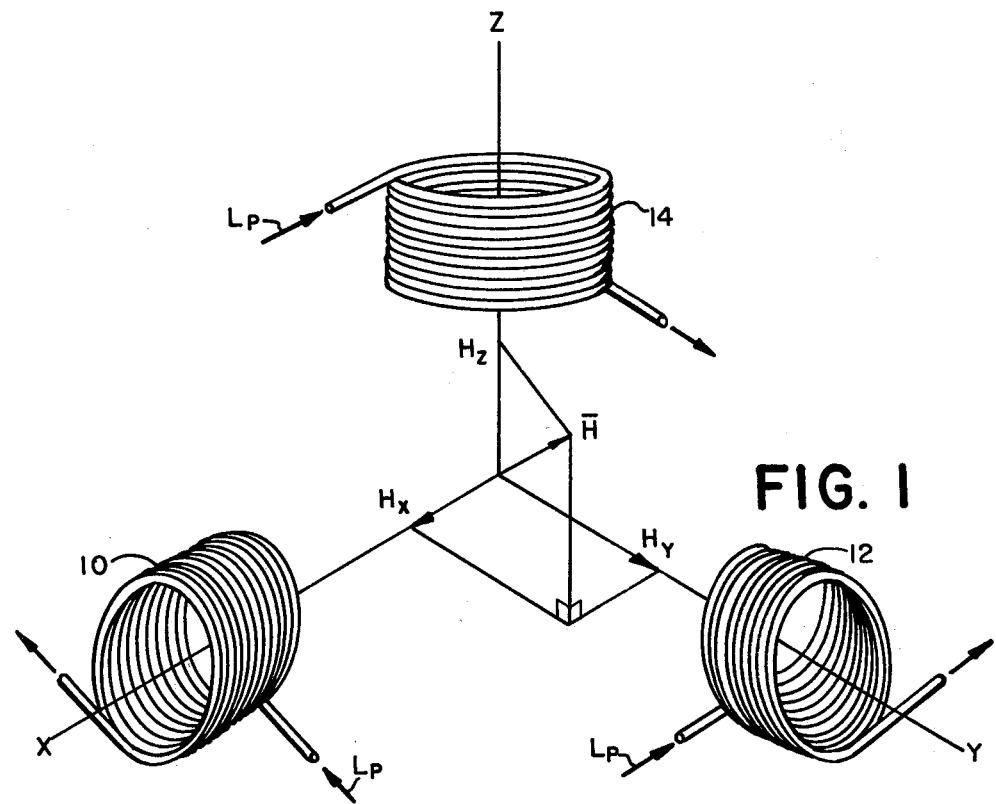
FIG. 1 is a schematic illustration of a triaxial set of fiber-optic coils as employed in one preferred embodiment of the magnetic field measuring system according to the present invention.

Referring now to FIG. 1, there is shown a magnetic field vector H in three-dimensional space having vector components $H_x$, $H_y$ and $H_z$ directed along respective orthogonal axes. According to one preferred embodiment of the present invention, a set of three coil members 10, 12 and 14 formed from cable of commonly available fiber-optic material, such as quartz or glass, are disposed in an orthogonal arrangement, each coil member being positioned substantially coaxial to one of the orthogonal axes. Each of the coil members 10, 12 and 14 contain substantially the same length of fiber-optic cable, preferably about 1000meters, with substantially the same number of turns, and is formed of a sufficiently large coil diameter, for example, about 10 centimeters, to avoid bending losses. Linearly polarized light $L_p$ generated by and emitted from a conventional polarized light source 16 (FIG. 2), such as a laser, is introduced into one end of each coil member 10, 12 and 14 for propagation therethrough subject to the Faraday effect of the magnetic field vector H acting via its components $H_x$, $H_y$ and $H_z$.

In accordance with the Faraday effect, the plane of polarization of linearly polarized light is rotated when the light is propagated through a medium under the influence of an external magnetic field. The amount of rotation, commonly called the Faraday rotation, is generally proportional to the component of the magnetic field in the direction of propagation of the light and the path length of the light in the medium, and may be expressed by the relation:

$$\theta_F = VHl \cos \phi$$

where
- $\theta_F$ = angle of Faraday rotation (minutes),
- V = Verdet constant (minutes/oersted-cm),
- H = applied field strength (oersteds),
- l = path length of light in the medium (cm), and
- $\phi$ = angle between the directions of the field and the propagated light (degrees).

By way of examples, in a field of 10,000 oersteds, the Faraday rotation ($\theta_F$) is 2°10′ for 1 cm of water and 2°46′ for 1 cm of quartz.

It should be noted that the Verdet constant (V), which is characteristic of the medium and also dependent on the wavelength of the propagated light, is conventionally defined as being positive in sign when the direction of Faraday rotation is the same as the direction of a current which would produce the applied magnetic field. The sign is independent of the direction of propagation of the light so that the total Faraday rotation can be multiplied by reflecting the light back and forth through the medium. Verdet constants for quartz and glass are typically about $2 \times 10^{-2}$ minutes/oersted-cm in the 0.5 to 0.6$\mu$ wavelength range.

For fiber-optic coil members 10, 12 and 14, the aforedescribed Faraday relation becomes modified because the projections of the magnetic field vector $\overline{H}$ affecting the respective coil members, namely those projections in the respective planes of each coil member, vary sinusoidally along the coil tangent. The resultant Faraday expressions for each of the coil members 10, 12 and 14 are $$\theta_{F(Coil\ 10)} = 4VH_1 rN$$

$$\theta_{F(Coil\ 12)} = 4VH_2 rN$$

$$\theta_{F(Coil\ 14)} = 4VH_3 rN$$

where
- $H_1$ is the field projection affecting coil member 10 and $= (H_y^2 + H_z^2)^{\frac{1}{2}}$,
- $H_2$ is the field projection affecting coil member 12 and $= (H_x^2 + H_z^2)^{\frac{1}{2}}$,
- $H_3$ is the field projection affecting coil member 14 and $= (H_x^2 + H_y^2)^{\frac{1}{2}}$,
- r = radius of coil members, and
- N = number of coil turns.

Thus, using the orthogonal set of fiber-optic coil members 10, 12 and 14, having known compositional and dimensional characteristics, to propagate the polarized light $L_p$ subject to the applied field projections ($H_1$, $H_2$, $H_3$) affecting each coil member, detection of the Faraday rotation of the light through the respective coil members provides parameters for measuring the applied magnetic field vector $\overline{H}$.

Figure 2:
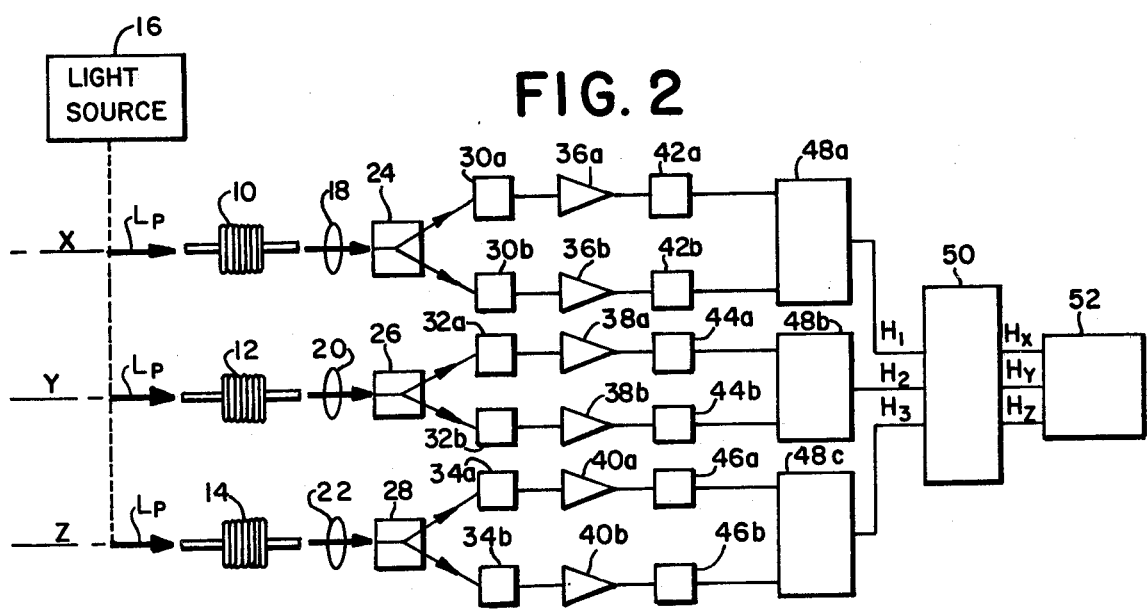
FIG. 2 is a block diagram of the preferred embodiment of the magnetic field measuring system including the fiber-optic coils of FIG. 1.

Referring now to FIG. 2 in conjunction with FIG. 1, fiber-optic coil members 10, 12 and 14 disposed along the x-, y- and z-axes, respectively, propagate the linearly polarized light $L_p$ emitted from the conventional light source 16 and introduced at one end of each coil member. A set of optical elements 18, 20 and 22 conventionally used to collimate light radiation are positioned at the opposite ends of respective coil members 10, 12 and 14 to receive the linearly polarized light $L_p$ emanating from the coil members and subjected to Faraday rotation of its plane of polarization. A set of commercially available Wollaston prisms 24, 26 and 28 are respectively positioned to receive the polarized light $L_p$ as directed from collimator elements 18, 20 and 22 for producing a pair of divergent beams of separate orthogonal polarizations. It should be noted that the separate polarizations of the divergent beams produced by the respective Wollaston prisms 24, 26 and 28 are characterized by distinct and variable beam intensities, a relative comparision of, which for each pair of beams is indicative of the amount of Faraday rotation experienced by the polarized light $L_p$ through each coil member 10, 12 and 14.

A series of conventional photodetectors 30a, 30b, 32a, 32b, 34a and 34b are positioned in pairs to receive the separate polarizations of the divergent beams emanating from respective Wollaston prisms 24, 26 and 28. Sensing the beam intensity of only the polarization directed thereto, each photodetector 30a, 30b, 32a, 32b, 34a and 34b produces a current signal proportional to the beam intensity in that polarization. A series of amplifiers 36a, 36b, 38a, 38b, 40a and 40b are electrically connected to respective photodetectors 30a, 30b, 32a, 32b, 34a and 34b to raise the level of the current signals produced thereby, as may be required for digital processing.

A set of conventional analog-to-digital converters 42a, 42b, 44a, 44b, 46a and 46b are respectively connected to amplifiers 36a, 36b, 38a, 38b, 40a and 40b for producing digitized information indicative of the respective beam intensities of the polarizations directed to photodetectors 30a, 30b, 32a, 32b, 34a and 34b. A group of conventional digital microprocessors 48a, 48b and 48c each connected to receive the digitized information from respective pairs of analog-to-digital converters 42a and 42b, 44a and 44b, and 46a and 46b are programmed to determine the respective magnetic field projections $H_1$, $H_2$ and $H_3$ affecting coil members 10, 12 and 14, respectively, based on the aforedescribed Faraday expressions, as modified for coil applications. Solving those expressions for $H_1$, $H_2$ and $H_3$, receiving the digitized information regarding beam intensities of the separate polarizations as an indication of the Faraday rotation ($\theta_F$) effected within the respective coil members 10, 12 and 14, and given the compositional and dimensional characteristics of each coil member, microprocessors, 48a, 48b and 48c evaluate the magnetic field projections $H_1$, $H_2$ and $H_3$, respectively, and produce digital signals indicative thereof.

A single digital microprocessor 50 of a conventional nature is connected to receive the digital signals produced by microprocessors 48a, 48b and 48c. Programmed in accordance with the mathematical relations $$H_x = (-H_1^2 + H_2^2 + H_3^2)^{\frac{1}{2}}/\sqrt{2},$$

$$H_y = (H_1^2 - H_2^2 + H_3^2)^{\frac{1}{2}}/\sqrt{2}, \text{ and}$$

$$H_z = (H_1^2 + H_2^2 - H_3^2)^{\frac{1}{2}}/\sqrt{2},$$

microprocessor 50 determines the orthogonal components of the magnetic field vector $\overline{H}$ and produces a set of digital signals indicative thereof. An electronic display unit 52 conventionally designed to process digital inputs is connected to receive the digital signals from microprocessor 50. Provided the digital signals indicative of the orthogonal field components $H_x$, $H_y$ and $H_z$, the display unit 52 indicates the magnitude and direction of the magnetic field vector $\overline{H}$ derived from a resolution of the orthogonal components. Furthermore, the display unit 52 may provide information regarding the declination of the magntic field, namely, the angle that the field vector $\overline{H}$ makes with the horizon, as well as the field heading with regard to an associated axis.

Figure 3:
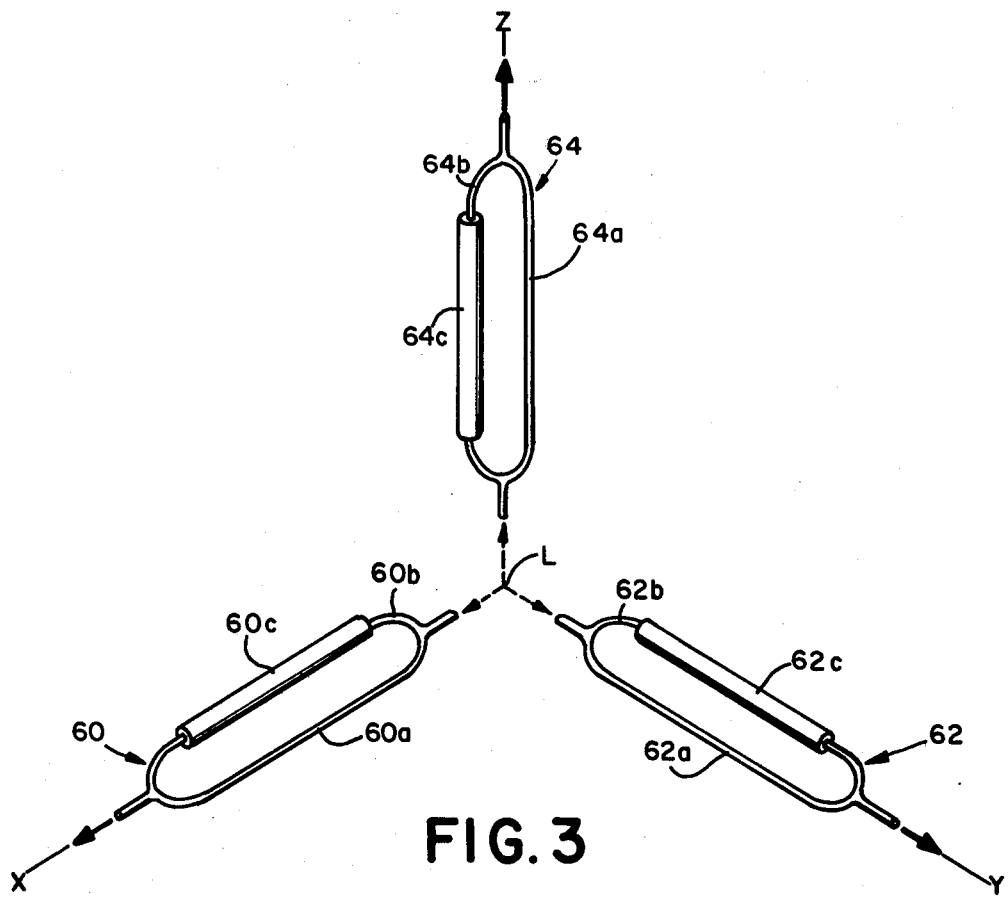
FIG. 3 is a schematic illustration of a triaxial set of fiber-optic cables as employed in a second preferred embodiment of the magnetic field measuring system according to the present invention.

Referring now to FIG. 3, there is shown a set of three fiber-optic cables 60, 62 and 64 orthogonally disposed in a triaxial arrangement in accordance with a second preferred embodiment of the present invention. Formed of a fiber-optic material, such as quartz or glass, similar to that of coil members 10, 12 and 14, cables 60, 62 and 64 are disposed substantially along an x-, y- and z-axis, respectively, and are bifurcated, each having a pair of substantially equilateral branches 60a and 60b, 62a and 62b, and 64a and 64b. Intimately connected onto one of the branches 60b, 62b and 64b, called the sensor branches, of each cable 60, 62 and 64 are respective amounts of a magnetostrictive material 60c, 62c and 64c, such as nickel, to subject the sensor branches to optical path length changes due to longitudinal magnetostriction of the material in the presence of a magnetic field. Connection of the magnetostrictive material 60c, 62c and 64c to the respective sensor branches 60b, 62b and 64b may be accomplished by bonding, plating, or any otherwise effective method of producing intimate contact with the fiber-optic material.

In accordance with the principle of magnetostriction, the magnetostrictive material 60c, 62c and 64c connected to sensor branches 60b, 62b and 64b will change in its length due to magnetic field changes in the longitudinal direction of the material. Thus, as the components of a magnetic field change along the sensor branches 60b, 62b and 64b, the optical path lengths through the sensor branches changes and thereby provide a measure of the magnetic field components in the direction of the respective branches. Using interferometry, the relative phase changes of light L, not necessarily polarized, propagated through the respective fiber-optic cables 60, 62 and 64 provide an indication of the orthogonal field components, $H_x$, $H_y$ and $H_z$.

Figure 4:
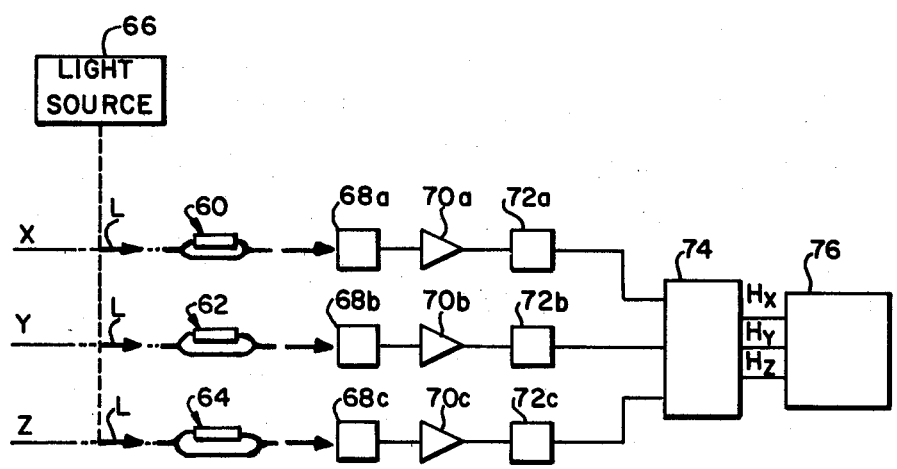
FIG. 4 is a block diagram of the second preferred embodiment of the field measuring system including the fiber-optic cables of FIG. 4.

Referring now to FIG. 4 in conjunction with FIG. 3, a light source 66 is coupled to one end of each fiber-optic cable 60, 62 and 64 thereby introducing light L from the source to the cables for propagation therethrough along orthogonal axes subject to a magnetic field. A set of three photodetectors 68a, 68b and 68c are positioned at the opposite ends of respective cables 60, 62 and 64 to receive the light L emanating from the cables. The photodetectors 68a, 68b and 68c detect the relative phase changes of the light L propagated through the respective fiber-optic cables 60, 62 and 64 and produces current signals indicative of the phase changes. A set of amplifiers 70a, 70b and 70c are electrically connected to respective photodetectors 68a, 68b and 68c to raise the level of the current signals produced thereby, as may be required for digital processing.

A set of conventional analog-to-digital converters 72a, 72b and 72c are respectively connected to amplifiers 70a, 70b and 70c for producing digitized information indicative of the relative phase changes of the light L.

A conventional digital microprocessor 74, similar to microprocessor 50 in FIG. 2, is connected to receive the digitized information from converters 72a, 72b and 72c. Programmed in accordance with the theoretical relationship between the magnetostriction-induced relative phase changes in the light L, propagated through the respective cables 60, 62 and 64, and the magnitude of the magnetic field component along the respective sensor branches 60b, 62b and 64c of the cables, microprocessor 74 produces a set of digital signals indicative of the orthogonal components $H_x$, $H_y$ and $H_z$ of the magnetic field present. A display unit 76, similar to display unit 52 in FIG. 2, is connected to receive the digital signals from microprocessor 74 for indicating the magnitude and direction of the field based on an evaluation of its orthogonal components.

Therefore, it is apparent that the disclosed invention provides an improved fiber-optic system for accurately measuring the magnitude and direction of a magnetic field present in the environment. The present invention also rapidly and continuously indicates information regarding the strength, declination and heading of the magnetic field. Furthermore, the disclosed magnetic field measuring system provides increased sensitivity to permit effective measurement of very small magnetic field vectors with a high reliability, particularly avoiding detection errors commonly caused by self-generated interference of electrical sensors and from wear of moving parts. In addition, the disclosed fiber-optic system is relatively inexpensive to construct and easily adaptable to existing magnetic field sensing applications.

Obviously, other embodiments and modifications of the present invention will readily come to those of ordinary skill in the art having the benefit of the teachings presented in the foregoing description and drawings. It is therefore to be understood that various changes in the details, materials, steps, and arrangement of parts, which have been described and illustrated to explain the nature of the invention, may be made by those skilled in the art within the principle and scope of the invention as expressed in the appended claims.

What is claimed is:

1. A system for measuring a single magnetic field, comprising:

a source of polarized light;

three fiber-optic means orthogonally disposed in a triaxial arrangement and optically coupled to said source for propagating the polarized light in three separate orthogonal directions through the field;

photodetector means optically connected to said fiber-optic means for producing a plurality of respective analog signals indicative of characteristic changes caused by the magnetic field in the polarized light propagated in each direction through the field; and processor means electrically connected to said photodetector means for digitally determining the respective orthogonal components of the magnetic field in the directions of the propagated light.

2. A magnetic field measuring system according to claim 1, further comprising:

display means connected to said processor means for indicating the magnitude and direction of the magnetic field.

3. A magnetic field measuring system according to claim 1, wherein said fiber-optic means comprises:
a set of three fiber-optic coils each disposed coaxially along a respective orthogonal axis and having a predetermined length and diameter.

4. A magnetic field measuring system according to claim 3, wherein said photodetector means comprises:
a set of Wollaston prisms each optically coupled to receive the polarized light from respective ones of said fiber-optic coils for producing a pair of divergent light beams of separate polarizations; and
a plurality of photodetectors grouped in pairs and optically connected to receive the divergent beams from said prisms for producing a plurality of current signals indicative of the intensities of the respective beams.

5. A magnetic field measuring system according to claim 4, wherein said photodetector means further comprises:
a set of optical elements coupled between respective ones of said fiber-optic coils and said prisms for collimating the polarized light emanating from said coils.

6. A magnetic field measuring system according to claim 4, wherein said processor means comprises:
a plurality of analog-to-digital converters each electrically coupled to respective ones of said photodetectors to produce digitized information indicative of beam intensities;
a plurality of first digital processors connected to said converters for producing a first set of digital signals indicative of magnetic field projections affecting respective ones of said coils; and
a second digital processor connected to receive the first set of digital signals from said plurality of first digital processors for producing a second set of digital signals indicative of the orthogonal components of the magnetic field.

7. A system for measuring a single magnetic field, comprising:
a source of polarized light;
three fiber-optic cables each disposed substantially along a respective orthogonal axis within a triaxial arrangement to propagate the polarized light in separate orthogonal directions through the field, said cables being bifurcated having substantially equilateral branches;
a magnetostrictive material intimately connected to one of the branches of each of said fiber-optic cables;
photodetector means optically connected to said fiber-optic cables for producing a plurality of respective current signals indicative of relative phase changes caused by the magnetic field of the polarized light propagated in each direction through said cables; and
processor means electrically connected to said photodetector means for digitally determining the respective orthogonal components of the magnetic fluid in the direction of the propagated polarized light.

8. A magnetic field measuring system according to claim 7, wherein said photodetector means comprises:
a set of three photodetectors each optically connected to respective ones of said fiber-optic cables for producing a plurality of current signals indicative of relative phase changes of the polarized light propagated through said cables.

9. A magnetic field measuring system according to claim 8, wherein said processor means comprises:
a set of three analog-to-digital converters each electrically coupled to respective ones of said photodetectors to produce digitized information indicative of the relative phase changes of the light; and
a digital processor connected to said converters for producing a set of digital signals indicative of the orthogonal components of the magnetic field.

10. A magnetic field measuring system according to claim 9, wherein said magnetostrictive material is nickel.

11. A system for measuring a single magnetic field, comprising:
a source of light radiation;
three fiber-optic cables each disposed substantially along a respective orthogonal axis to propagate the light radiation in separate orthogonal directions through the field, said cables being bifurcated having substantially equilateral branches;
a magnetostrictive material intimately connected to one of the branches of each of said fiber-optic cables;
photodetector means optically connected to said fiber-optic cables for producing a plurality of respective current signals indicative of relative phase changes caused by the magnetic field of the light radiation propagated in each direction through said cables; and
processor means electrically connected to said photodetector means for digitally determining the respective orthogonal components of the magnetic field in the directions of the propagated light radiation.

12. A magnetic field measuring system according to claim 11, further comprising:
display means connected to said processor means for indicating the magnitude and direction of the magnetic field.

13. A magnetic field measuring system according to claim 11, wherein said photodetector means comprises:
three photodetectors each optically connected to respective ones of said fiber-optic cables.

14. A magnetic field measuring system according to claim 13, wherein said processor means comprises:
a set of three analog-to-digital converters each electrically coupled to respective ones of said photodetectors to produce digitized information indicative of the relative phase changes of the light; and
a digital processor connected to said converters for producing a set of digital signals indicative of the orthogonal components of the magnetic field.

15. A magnetic field measuring system according to claim 14, wherein said magnetostrictive material is nickel.

* * * * *